United States Patent
Morita et al.

(10) Patent No.: US 7,150,911 B2
(45) Date of Patent: Dec. 19, 2006

(54) ELECTRICAL INSULATING VAPOR GROWN CARBON FIBER AND METHOD FOR PRODUCING THE SAME, AND USE THEREOF

(75) Inventors: Toshio Morita, Kanagawa (JP); Hitoshi Inoue, Kanagawa (JP); Ryuji Yamamoto, Kanagawa (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/067,266

(22) Filed: Feb. 7, 2002

(65) Prior Publication Data
US 2002/0146562 A1  Oct. 10, 2002

Related U.S. Application Data

(60) Provisional application No. 60/270,143, filed on Feb. 22, 2001.

(30) Foreign Application Priority Data
Feb. 8, 2001 (JP) ............................ P2001-032697

(51) Int. Cl.
*B32B 9/00* (2006.01)
*D01F 9/12* (2006.01)

(52) U.S. Cl. .................. 428/368; 428/367; 428/408; 423/447.1; 423/447.2; 423/447.7

(58) Field of Classification Search .............. 428/408, 428/367, 368; 423/447.1, 447.2, 447.7; 502/174, 502/202
See application file for complete search history.

(56) References Cited

U.S. PATENT DOCUMENTS

| 4,944,904 | A | * | 7/1990 | Singh et al. ............. 428/408 |
| 5,021,367 | A | * | 6/1991 | Singh et al. ............. 501/88 |
| 5,132,254 | A | * | 7/1992 | Stempin et al. ............. 501/32 |
| 5,294,489 | A | * | 3/1994 | Luthra et al. ............. 428/379 |
| 5,387,299 | A | * | 2/1995 | Singh et al. ............. 156/89 |
| 5,433,906 | A | * | 7/1995 | Dasch et al. ............. 264/117 |
| 5,594,060 | A | * | 1/1997 | Alig et al. ............. 524/496 |
| 5,643,670 | A | * | 7/1997 | Chung ............. 428/367 |
| 5,650,370 | A | * | 7/1997 | Tennent et al. ............. 502/174 |
| 6,235,674 | B1 | * | 5/2001 | Tennent et al. ............. 502/174 |
| 6,284,358 | B1 | * | 9/2001 | Parlier et al. ............. 428/294.4 |
| 6,489,026 | B1 | * | 12/2002 | Nishimura et al. ............. 428/367 |
| 6,780,388 | B1 | * | 8/2004 | Masuko et al. ............. 423/449.1 |
| 2002/0051903 | A1 | * | 5/2002 | Masuko et al. ............. 429/44 |
| 2002/0145652 | A1 | * | 10/2002 | Lawrence et al. ............. 347/100 |
| 2002/0146562 | A1 | * | 10/2002 | Morita et al. ............. 428/375 |
| 2003/0044685 | A1 | * | 3/2003 | Yanagisawa et al. ............. 429/231.8 |
| 2003/0049443 | A1 | * | 3/2003 | Nishimura et al. ............. 428/364 |
| 2003/0091897 | A1 | * | 5/2003 | Oogaku et al. ............. 429/181 |

FOREIGN PATENT DOCUMENTS

| EP | 499 234 | * | 8/1992 |
| EP | 583 062 A1 | * | 2/1994 |
| JP | 60-27700 | | 2/1985 |
| JP | 60-54998 | | 3/1985 |
| JP | 7-150419 | | 6/1995 |
| JP | 2002235279 A | * | 8/2002 |
| WO | WO 200058536 A1 | * | 10/2000 |

* cited by examiner

*Primary Examiner*—Jill Gray
(74) *Attorney, Agent, or Firm*—Sughrue Mion, PLLC

(57) ABSTRACT

An electrical insulating vapor grown carbon fiber containing a vapor grown carbon fiber having a fiber diameter of 0.01 to 0.5 μm, wherein the surface thereof is partially or entirely coated with an electrical insulating material and a method of producing thereof is disclosed.

15 Claims, No Drawings

ELECTRICAL INSULATING VAPOR GROWN CARBON FIBER AND METHOD FOR PRODUCING THE SAME, AND USE THEREOF

CROSS REFERENCE TO RELATED APPLICATIONS

This application is an application filed under 35 U.S.C. §111(a) claiming benefit pursuant to 35 U.S.C. §119(e)(1) of the filing date of Provisional Application No. 60/270,143 filed Feb. 22, 2001 pursuant to 35 U.S.C. §111(b).

FIELD OF THE INVENTION

The present invention relates to a vapor grown carbon fiber coated with boron nitride suitable as an electrical insulating heat-conductive filler, which is used for composite materials comprising a heat-conductive material having high heat conductivity and high electrical insulating property and a composition such as synthetic resin or synthetic rubber. The present invention also relates to a method for producing the vapor grown carbon fiber.

BACKGROUND OF THE INVENTION

Carbon fibers (hereinafter simply referred to as "CF") in general have excellent properties such as high strength, high elastic modulus, high electrical conductivity and high heat conductivity, and are being widely used in various composite materials by taking advantage of these properties. The uses thereof are not limited to products in the field of using the mechanical properties of CF, such as high strength and high elastic modulus, but also include applications as a filler. For example, CF can be used as a filler for releasing heat from electronic instruments such as personal computers and portable telephones by using the high heat conductivity of CF or carbon materials to overcome the heat generation trouble ascribable to miniaturization, high densification, high performance and the like of these electronic devices or parts. By using their high electrical conductivity, CF can be used as an electrically conducting resin filler for electromagnetic wave shielding materials, antistatic materials and the like or as a filler for use in the electrostatic coating for resin accompanying a reduction in weight of motor vehicles. Furthermore, by using the properties as a carbon material, such as chemical stability, heat stability and fine structure, CF could be used as a field emission material such as in a flat display.

CF is conventionally produced as a so-called organic carbon fiber which is produced by heat-treating and thereby carbonizing fiber such as PAN-(polyacrylonitrile), pitch- or cellulose-based fiber. In the case of using these CF fibers as a filler for fiber reinforced composite materials, the contact area with the base material is increased to elevate the reinforcing effect, for example, by reducing the fiber diameter or increasing the fiber length.

However, the reduction in diameter of the organic fiber as a starting material of CF is limited and can give at best a fiber diameter of from 5 to 10 μm depending on the production method and fine CF having a fiber diameter of 1 μm or less, particularly on the order of 10 to 200 nm, cannot be produced. Even if such fine CF could be produced, the ratio of length to fiber (i.e., aspect ratio) is limited and production with good profitability cannot be attained. As such, CF having a small diameter and a large aspect ratio has been not industrially produced, though this has been demanded.

On the other hand, studies of vapor grown carbon fiber started in the latter half of 1980s. The production method of these fibers is utterly different from those of organic fibers. As for vapor grown carbon fiber (hereinafter simply referred to as "pyrolytic CF"), it is known that pyrolytic CF having a diameter of 1 μm or less, approximately tens of nm, can be obtained by the vapor phase pyrolysis of a gas such as hydrocarbon in the presence of a metal catalyst.

For example, a method of introducing an organic compound as a starting material, such as benzene, into a high-temperature reaction furnace together with an organic transition metal compound catalyst such as ferrocene using a carrier gas and producing pyrolytic CF on a substrate (see, JP-A-60-27700 (the term "JP-A" as used herein means an "unexamined published Japanese patent application")), a method of producing pyrolytic CF in a floated state (see, JP-A-60-54998), or a method of growing pyrolytic CF on the wall of a reaction furnace (see, Japanese Patent No. 2778434) have been proposed. The pyrolytic CF produced by these methods is heat-treated at a high temperature to remove any attached pyrolysis products and enhance the crystallinity and the obtained final vapor grown carbon fiber (this carbon fiber is hereinafter simply referred to as "VGCF"; pyrolytic CF, VGCF and the like are sometimes collectively called "vapor grown carbon fiber") is used for various uses.

By these production methods, vapor grown carbon fiber having a high electrical conductivity, excellent heat conductivity, a fine diameter size and a large aspect ratio and being suitable for filler materials can be obtained. At present, VGCF having a diameter of approximately from 10 to 200 nm and an aspect ratio of approximately from 10 to 500 is easily mass-produced and used as an electrically or thermally conducting filler material, for example, in fillers of electrically conducting resin or in additives of a lead storage battery.

This vapor grown carbon fiber is characterized by the shape or crystal structure and the fiber has a structure such that carbon hexagonal network crystals are stacked by rolling annular rings into a cylindrical shape and an extremely thin hollow part is present in the center part.

The crystallinity of vapor grown carbon fiber is easily enhanced by the graphitization as compared with conventional PAN-based CF and pitch-based CF, however, due to reduction in the fiber diameter to the order of 10 to 200 nm, graphite crystal is difficult to grow and poor crystallinity results as compared with natural graphite.

In order to enhance the crystallinity of VGCF, there has been previously disclosed a method of adding a boron compound during the graphitization of pyrolytic CF and thereby doping boron into VGCF, so that the growth of graphite crystal can be promoted and VGCF improved in the crystallinity can be obtained.

For improving the heat-releasing property of electronic devices, an electrical insulating material having high heat conductivity is necessary as a heat-releasing filler and for this purpose, alumina and the like are predominantly used. Particularly, accompanying the miniaturization and high densification of electronic devices in recent years, a heat-releasing filler having higher heat conductivity is demanded and to satisfy this requirement, alumina is formed into a spherical shape to improve the filling density in a composite material and thereby elevate the heat conductivity, or aluminum nitride and the like having higher heat conductivity are being used as a heat-releasing filler. The heat-releasing member of an electric device must be electrically insulating in many cases and the heat-releasing filler is also demanded to be an electrically insulating and highly heat-conductive heat-releasing filler.

At present, in the case where the electrical insulating property is necessary, fine particles of an inorganic material such as alumina and aluminum nitride are used as the heat-releasing filler, though the heat conductivity is slightly unsatisfactory. The heat release is attained by the heat conduction passing through the contact points between fine particles of the filler and thus, the contact point is rate-determining for the amount of heat released and stands as an obstacle to the heat conduction. On the other hand, since the filler is a fine particle, the contact area for the heat conduction is small and the number of contact points where the heat conduction passes through is large. Therefore, the heat releasing property is greatly reduced. Accordingly, for improving the heat release, it is preferred to reduce the number of contact points, for example, to use a thin fibrous heat-releasing filler.

SUMMARY OF THE INVENTION

An object of the present invention is to provide a vapor grown carbon fiber coated with a fine fibrous electrically insulating material (hereinafter referred to as "coated VGCF"), as a heat-releasing filler for heat-conductive and heat insulating composite materials.

Another object of the present invention includes providing a method for producing the vapor grown carbon fiber.

The present inventors have succeeded in developing a coated VGCF having an extremely small fiber diameter and ensuring excellent heat conductivity as a whole while having electrical insulating property by heat-treating pyrolytic CF to improve the crystallinity and thereby enhance the heat conductivity and electrical conductivity and at the same time, coating the surface with an electrically insulating material More specifically, the present invention provides the following embodiments.

[1] an electrical insulating vapor grown carbon fiber comprising a vapor grown carbon fiber having a fiber diameter of 0.01 to 0.5 µm, wherein the surface thereof is partially or entirely coated with an electrical insulating material,

[2] the electrical insulating vapor grown carbon fiber as described in [1] above, wherein the electrical insulating material is boron nitride,

[3] the electrical insulating vapor grown carbon fiber as described [2] above, wherein the boron nitride is present in an amount of about 2% by mass or more based on the entire amount of vapor grown carbon fiber and the Co value is 0.680 nm or less,

[4] the electrical insulating vapor grown carbon fiber as described in [2] or [3] above, wherein the amount of boron in a depth of 1 nm from the surface of the vapor grown carbon fiber is about 10% by mass or more,

[5] the electrical insulating vapor grown carbon fiber as described in any one of [1] to [4] above, wherein the specific resistivity is about $10^3$ $\Omega\cdot cm$ or more and the heat conductivity is about 150 $Wm^{-1}K^{-1}$ or more when compressed at a bulk density of 0.8 $g/cm^3$,

[6] a method for producing an electrical insulating vapor grown carbon fiber, comprising mixing a boron compound with a vapor grown carbon fiber having a fiber diameter of 0.01 to 0.5 µm to form a mixture and heat-treating the mixture at 2,000° C. or more in the presence of a nitrogen compound,

[7] a method for producing an electrical insulating vapor grown carbon fiber coated with boron nitride, comprising mixing a boron compound with a vapor grown carbon fiber having a fiber diameter of 0.01 to 0.5 µm to form a mixture, compressing the mixture and heat-treating the compressed mixture at 2,000° C. or more in the presence of a nitrogen compound,

[8] the method for producing an electrical insulating vapor grown carbon fiber as described in [6] or [7] above, wherein the nitrogen compound is nitrogen,

[9] the method for producing an electrical insulating vapor grown carbon fiber as described in any one of [6] to [8] above, wherein the boron compound is at least one member selected from the group consisting of elementary boron, boric acid, borate, boron oxide, $B_4C$ and boron nitride,

[10] the method for producing an electrical insulating vapor grown carbon fiber as described in any one of [6] to [9] above, wherein the mixture of the boron compound and the vapor grown carbon fiber has a boron concentration of about 1 to about 30% by mass in terms of the boron element,

[11] An electrical insulating composite material comprising a synthetic resin or synthetic rubber composition containing an electrical insulating vapor grown carbon fiber comprising a vapor grown carbon fiber having a fiber diameter of 0.01 to 0.5 µm, wherein the surface is partially or entirely coated with an electrical insulating material,

[12] the electrical insulating composite material as described in [11] above, wherein the electrical insulating material is boron nitride,

[13] the electrical insulating composite material comprising a synthetic resin or synthetic rubber composition containing the electrical insulating vapor grown carbon fiber described in any one of [3] to [5] above, and

[14] a heat-releasing material comprising the electrical insulating vapor grown carbon fiber described in any one of [1] to [5] above.

DETAILED DESCRIPTION OF THE INVENTION

The present invention is described in detail below.

Vapor Grown Carbon Fiber

The CF for use in the present invention is produced by introducing an organic compound as a starting material, such as benzene, into a high-temperature reaction furnace together with an organic transition metal compound as a catalyst, such as ferrocene, using a carrier gas, and vapor pyrolyzing the compound. The fiber diameter thereof is from 0.01 to 0.5 µm and the aspect ratio is approximately from 10 to 500.

Examples of this production method include a method of producing pyrolytic CF on a substrate (see, JP-A-60-27700), a method of producing pyrolytic CF in the floated state (see, JP-A-60-54998), and a method of growing pyrolytic CF on the wall of a reaction furnace (see, Japanese Patent No. 2778434). The CF for use in the present invention may be produced by these methods.

The thus-produced pyrolytic CF may be used as it is as a stock material for the coating of an electrical insulating material but at this stage, pyrolysis products derived from the starting material organic compound or the like are adhering to the surface or the crystallinity of the fiber structure forming the CF is insufficient. Therefore, in order to remove the impurities such as pyrolysis products or to enhance the crystal structure as CF, the pyrolytic CF is usually heat-treated in an inert gas atmosphere and used as the stock material.

For the treatment of impurities such as pyrolysis products originated in the starting material, the heat treatment is performed at about 800 to about 1,500° C. in an inert gas such as argon. For the improvement of crystallinity of the carbon structure, the heat treatment is performed at approximately from 2,000 to 3,000° C. in an inert gas such as argon. These are commercially available as VGCF.

As for the electrical insulating material, organic or inorganic compounds or compositions such as rubber, plastic and glass are known, but in view of resistance against heat or chemicals, inorganic compounds or compositions are preferred. The organic and/or inorganic compounds or compositions can be used in the form of a melt, a sintered body, a film or the like.

The volume resistivity ($\Omega$cm) of the electrical insulating material may be sufficient if it is $10^{12}$ or more, preferably $10^{15}$ or more, and examples of the electrical insulating material which can be used include alumina, sapphire, mica, silica, silicon carbide, aluminum nitride, boron nitride, silicon nitride, sialon, magnesium oxide, beryllium oxide and zirconium oxide. Among these, preferred are boron nitride, silicon nitride and silicon carbide, more preferred is boron nitride.

The coating of at least a part of the VGCF surface may be attained by coating, depositing or dipping of an electrical insulating material on VGCF. In particular, for coating the VGCF surface with boron nitride, a method of mixing a boron compound as a boron source with a vapor grown carbon fiber and heat-treating the mixture with a nitrogen compound as a nitrogen source, for example, $N_2$, $NH_3$, urea, $N_2H_4$ or a compound capable of generating $N_2$ upon reaction, such as $NH_3/NO$ and $NH_3/NO_2$, at approximately 2,000 to 3,000° C. in an atmosphere containing nitrogen gas ($N_2$), preferably in an atmosphere containing nitrogen gas alone, is preferably used. The purity of $N_2$ may be about 98% or more but is preferably 99.8% or more, more preferably 99.99% or more. The coating conditions may be sufficient if the necessary $N_2$ concentration can be maintained, whether a closed system or an open system is employed, in an $N_2$ stream. The boron compound used here serves not only as a source of boron nitride coated on the VGCF surface but also to improve the carbon crystallinity of VGCF.

With respect to the boron compound as the boron source, almost all compounds containing boron can be used. This compound preferably reacts with nitrogen gas in the atmosphere to produce boron nitride on the CF surface under the conditions of 2,000° C. or more. Examples of this compound include elementary boron, boric acid, borate, boron oxide, $B_4C$ and BN. Among these, $B_4C$ and boron oxide are preferred.

The amount of boron compound used is, in terms of the boron concentration in the mixture of boron compound and vapor grown carbon fiber, from 1 to 30% by mass or more, preferably from 2 to 25% by mass, more preferably from 5 to 20% by mass. If the boron concentration is less than 1% by mass, the coverage on the VGCF surface is insufficient because of production of boron nitride in a small amount, and a sufficiently high electric insulating property cannot be obtained, though the crystallinity of VGCF is improved. On the other hand, if the boron concentration exceeds 30% by mass, not only does the boron nitride cover the VGCF surface, but also boron nitride particles are produced on the fiber surface and degrade the function as a fiber.

The stock material fine fiber may be a fiber obtained by previously grinding or powdering the starting material vapor grown carbon fiber. The degree of grinding or powdering may be sufficient if the fiber can be mixed with boron or a boron compound. More specifically, the fiber is further subjected to a filler-forming treatment such as grinding, powdering or classification after the coating treatment with an insulating material (hereinafter sometimes referred to as "BN coating treatment"). Therefore, the fiber length before the BN coating treatment may not be a proper length suitable for many uses but may be sufficient if the carbon fiber can be mixed with boron or a boron compound. The CF obtained by the vapor growth process generally has a size (diameter) of approximately from 0.01 to 1 μm and a length of approximately from 0.5 to 400 μm and can be used as it is. Also, a particle agglomerate (which can be regarded as an independent particle) resulting from aggregation of flocks of the fiber may also be used.

The starting material fine vapor grown carbon fiber has a three-dimensional steric structure and not only readily forms a flock state, but also has extremely small bulk density and very large void percentage. Moreover, the difference in specific gravity from the boron compound added is large. Therefore, the carbon fiber and boron compound cannot be uniformly contacted by merely mixing these two components.

For effectively performing the introduction and reaction of boron, the fiber and boron or a boron compound are thoroughly mixed to attain uniform contact as much as possible. For this purpose, the boron compound particles used must have a particle size as small as possible. If the particle size is large, a high concentration region is partially generated and gives rise to consolidation. Specifically, the particle size is, in terms of the average particle size, 100 μm or less, preferably 50 μm or less, more preferably 20 μm or less.

In the case of a water-soluble boron compound such as boric acid, a method of adding this compound in the form of an aqueous solution to CF and evaporating the water, or a heating process using equipments such as a compartment tray dryer, a fluidized dryer, a rotary kiln, a micro-wave drying equipment, to evaporate the water may be used. By uniformly mixing the aqueous solution, the boron compound can be uniformly attached to the CF surface after the evaporation of water.

As described above, the vapor grown carbon fiber has a small bulk density of about 0.01 g/cm³ or less when the fiber is in an agglomerate state after the production. Even after the heat treatment followed by grinding, powdering or classification, the product usually has a bulk density of approximately from 0.01 to 0.08 g/cm³. As such, this fine carbon fiber has a large void percentage and if this fiber is subjected as it is to a boron nitride-coating treatment, a heat-treatment furnace having a very large volume is necessary and this brings about not only high equipment cost but also bad productivity.

Therefore, unlike usual carbon materials, the boron nitride-coating treatment must be performed in a highly efficient manner.

For example, after uniformly mixing the fiber and boron or a boron compound, the mixture as it is may be heat-treated, however, the mixture is preferably highly densified and while maintaining (fixing) this state as much as possible, heat-treated. For realizing this, a method of mixing the fiber and boron or a boron compound and then fixing the mixture through pressurization, compression and high densification before the heat-treatment is preferably used in the present invention.

In this case, the method for mixing the fiber and boron or a boron compound may be any insofar as uniformity can be maintained. The mixing apparatus may be any commercially available mixing apparatus insofar as uniform mixing can be attained, however, since fine carbon fiber is readily flocked, a Henschel mixer with a chopper for grinding the flocked carbon fibers is preferred. The stock fiber used may be the fiber itself produced as above or may be a heat-treated product of the fiber after heat-treatment at a temperature of 1,500° C. or less. However, in view of the profitability and the performance, a method of mixing the produced fiber itself is preferred.

For highly densifying and fixing the mixture of fiber and boron or a boron compound not to cause separation between the fiber and the boron or boron compound, any method may be used such as a forming method, a granulation method or a method of compressing and stuffing the mixture into a fixed shape in a crucible or the like. In the case of forming, the formed article may have any shape such as plate or rectangular parallelepiped.

The bulk density of the high densified and fixed mixture is 0.02 g/cm$^3$ or more, preferably 0.03 g/cm$^3$ or more.

When the pressure is released after compressing the mixture into a formed article, the volume is somewhat expanded to lower the bulk density and in this case, the bulk density at the compression is adjusted to give a bulk density of 0.02 g/cm$^3$ or more when fixed after the release of pressure. For elevating the treatment efficiency, the fiber charged into a vessel may also be compressed or heat-treated in the compressed state using a pressure plate or the like to give a bulk density of 0.02 g/cm$^3$ or more.

After the addition of a boron compound and the subsequent densification, the fiber is then heat-treated.

The heat-treatment temperature for coating the VGCF surface with boron nitride must be from 2,000 to 3,000° C., preferably from 2,000 to 2,500° C. If the treatment temperature is less than this range, boron nitride is not produced and the graphite crystal of VGCF grows insufficiently.

In the heat treatment, a normal graphitization furnace such as resistance heating furnace, high frequency furnace and Acheson furnace can be used. During the elevation of temperature up to the heat-treatment temperature, production and diffusion of boron take place due to the decomposition of the boron compound. Therefore, the temperature elevation time is preferably shorter. For facilitating the diffusion of boron, it may also be possible to place a mixture of a boron compound and VGCF in a vessel such as a graphite crucible, and heat-treat the mixture.

The vapor grown carbon fiber before the heat-treatment with a boron compound may by any one of (1) the pyrolytic CF itself before the heat-treatment for removing the pyrolysis products such as tar adhering to the surface of the fiber after the production, (2) the pyrolytic CF heat-treated in an inert gas such as argon at about 800 to about 1,500° C., and (3) VGCF after the graphitization at about 2,000 to about 3,000° C. for enhancing the crystallinity of the carbon structure.

The nitrogen atmosphere during the heat treatment may be sufficient insofar as, for example, in the case of a high frequency heating furnace using a graphite cylinder as a heat generator, the nitrogen atmosphere can be maintained.

In the present invention, the "coating" may be sufficient if boron nitride is present on at least a part of the VGCF surface, preferably to occupy 70% or more, more preferably 80% or more of the entire surface. The boron nitride may be present uniformly or non-uniformly and the density may be high or low, however, the boron nitride is preferably present on the entire VGCF surface rather than on just a part of the surface. In a depth of about 1 nm from the surface of the vapor grown carbon fiber, the boron content, as determined by X-ray photoelectron analysis, is 10% by mass or more, preferably 20% by mass or more, more preferably 30% by mass or more. (The term "surface" used in the context of the amount of boron includes the surface of the coating.) This boron content may be attained if boron nitride content is 2% by mass or more based on the entire amount (mass) of the VGCF. B or N may be present not only on the VGCF surface but also in the inside of VGCF.

The electrical insulating property of boron nitride-coated VGCF of the present invention can be evaluated by the resistivity thereof. As for the method of measuring the resistivity, since the coated VGCF is powder, the resistivity of the powder consolidated to a bulk density of 0.8 g/cm$^3$ is measured. The resistivity of the coated VGCF of the present invention is 10$^3$ Ω·cm or more, preferably 10$^5$ Ω·cm or more, more preferably 10$^6$ Ω·cm or more. The heat conductivity of the boron nitride-coated VGCF of the present invention is greatly affected by impurities or porosity, and is preferably 150 Wm$^{-1}$K$^{-1}$ (150 Jm$^{-1}$s$^{-1}$K$^{-1}$) or more at room temperature.

The VGCF of the present invention is improved in the crystallinity of the carbon fiber and the coated boron nitride has good heat conductivity, however, since the crystallinity of VGCF governs the heat conductivity, the heat conductivity can be evaluated by Co (the lattice distance of the carbon structure) as an index for the graphite structure of carbon. The Co value [$d_{002}$ (interlayer spacing)×2] is preferably 0.680 nm or less. If the Co exceeds this range, good heat conductivity cannot be obtained. In the case of incorporating the carbon fiber of the present invention into a synthetic resin to obtain an electrical insulating composite material, the synthetic resin may be plastic, synthetic rubber or the like. In the case of using the boron nitride-coated VGCF of the present invention as a heat-releasing filler for plastic, the heat conductivity of the material varies depending on the VGCF content but the heat conductivity of the material can be determined by the plate comparison method according to JIS A-1412, a cylinder method, a plate direct method or a non-stationary method such as laser flash method.

According to the present invention, a coated VGCF having good heat conductivity and high electrical insulating property can be provided and this fiber can be very advantageously used as a heat-releasing filler of composite materials, such as a radiation board of electronic devices and the like.

EXAMPLES

The present invention is described in further detail below. The Examples are not intended to limit the scope of the present invention, and should not be construed as doing so.

Example 1

A pyrolytic CF having a fiber diameter of 0.1 to 0.2 μm and an aspect ratio of about 20 to about 500 was produced by the method described in Japanese Patent No. 2,778,434. This pyrolytic CF was stuffed into a graphite crucible and heat-treated at 1,200° C. for 20 minutes in an argon atmosphere.

The obtained pyrolytic CF was taken out and mixed with 10% by mass of $B_4C$ (produced by Wako Pure Chemical Industries, Ltd.). The mixture was again stuffed into a graphite crucible and heat-treated in a nitrogen atmosphere by elevating the temperature to 2,400° C. over about 2 hours for a holding time of 60 minutes (as a holding time necessary for making the temperature uniform even in the center of the graphite crucible in this Example).

After the heat-treatment, a classification operation as a post-treatment was performed to remove carbon particles and the like produced as a by-product during the production of coated VGCF and the obtained fiber was used as a boron nitride-coated VGCF sample.

This sample was evaluated by measuring the boron content based on the VGCF total amount, the resistivity and the Co value. The results obtained are shown in Table 1. Furthermore, the contents of boron and nitrogen on the surface of the vapor grown carbon fiber coated with boron nitride of the present were determined by X-ray photoelectron analysis. As a result, the boron content and the nitrogen content in the depth of about 1 nm from the surface were such that boron was 39% by mass and nitrogen was 50% by mass.

Example 2

The same treatment as in Example 1 was performed by changing the amount of $B_4C$ to 20% by mass. The evaluation results thereof are shown in Table 1.

Comparative Example 1

The same treatment as in Example 1 was performed by not adding $B_4C$. The evaluation results thereof are shown in Table 1.

Comparative Example 2

The same treatment as in Example 1 was performed in an argon atmosphere in place of the nitrogen atmosphere. The results obtained are shown in Table 1.

TABLE 1

| Evaluation Item | Boron Content (% by mass) | Co (nm) | Resistivity |
|---|---|---|---|
| Example 1 | 4 | 0.677 | $1 \times 10^4$ |
| Example 2 | 8 | 0.675 | $1 \times 10^5$ |
| Comparative Example 1 | <0.05 | 0.683 | 0.01 |
| Comparative Example 2 | 4 | 0.677 | 0.005 |

Example 3

A composite material comprised of polyethylene terephthalate (PET) containing 30% by mass of the boron nitride-coated VGCF obtained in Example 1 was prepared and the heat conductivity was measured by the laser flash method.

The heat conductivity was 45 $Wm^{-1}K^{-1}$ at room temperature in the orientation direction of the boron nitride-coated VGCF.

According to the present invention, an electrical insulating VGCF having good heat conductivity can be provided and this fiber can be used, particularly, as a heat-releasing filler of composite materials, such as radiation board of electronic devices.

In particular, when the surface of VGCF having a fiber diameter of 0.01 to 0.5 μm is coated with boron nitride, the resistivity of the fiber compressed to a bulk density of 0.8 g/cm³ is $10^3$ Ω·cm or more.

Furthermore, the fiber exhibits a heat conductivity of 150 $Wm^{-1}K^{-1}$ or more and thus, can have high heat conductivity.

While the invention has been described in detail and with reference to specific embodiments thereof, it will be apparent to one skilled in the art that various changes and modifications can be made therein without departing from the spirit and scope thereof.

What is claimed is:

1. An electrical insulating vapor grown carbon fiber having a fiber diameter of 0.01 to 0.5 μm, a hollow part in the center of the fiber and a boron concentration formed from a mixture of a boron compound and a vapor grown carbon fiber, the mixture having a boron concentration of about 1 to about 30% by mass in terms of a boron element, wherein the surface thereof is partially or entirely coated with an electrical insulating material of boron nitride and the amount of boron in a depth of 1 nm from the surface of the vapor grown carbon fiber is about 10% by mass or more, based on the entire mass of the vapor grown fiber having a depth of 1 nm from the surface, and wherein the electrical insulating vapor grown carbon fiber has a specific resistivity of $10^3$ Ω·cm or more when compressed at a bulk density of 0.8 g/cm³.

2. The electrical insulating vapor grown carbon fiber as described in claim 1, wherein the boron nitride is present in an amount of about 2% by mass or more based on the entire amount of vapor grown carbon fiber and the vapor grown carbon fiber has a Co value of 0.680 nm or less.

3. The electrical insulating vapor grown carbon fiber as described in claim 1, wherein the fiber has a heat conductivity of about 150 $Wm^{-1}K^{-1}$ or more when compressed at a bulk density of 0.8 g/cm³.

4. A method for producing an electrical insulating vapor grown carbon fiber coated with boron nitride, comprising mixing a boron compound with a vapor grown carbon fiber having a fiber diameter of 0.01 to 0.5 μm to form a mixture, compressing the mixture and heat-treating the compressed mixture at 2,000° C. or more in the presence of a nitrogen compound to form a boron nitride electrical insulating material.

5. The method for producing an electrical insulating vapor grown carbon fiber as described in claim 4, wherein the nitrogen compound is nitrogen.

6. The method for producing an electrical insulating vapor grown carbon fiber as described in claim 4, wherein the boron compound is at least one member selected from the group consisting of elementary boron, boric acid, borate, boron oxide, $B_4C$ and boron nitride.

7. The method for producing an electrical insulating vapor grown carbon fiber as described in claim 4, wherein the mixture of the boron compound and the vapor grown carbon fiber has a boron concentration of about 1 to about 30% by mass in terms of the boron element, based on the entire mass of the vapor grown carbon fiber.

8. The method for producing an electrical insulating vapor grown carbon fiber as described in claim 4, wherein the amount of boron in a depth of 1 nm from the surface of the vapor grown carbon fiber is about 10% by mass or more, based on the entire mass of the vapor grown fiber having a depth of 1 nm from the surface.

9. An electrical insulating composite material comprising a synthetic resin or synthetic rubber composition containing an electrical insulating vapor grown carbon fiber having a fiber diameter of 0.01 to 0.5 μm, wherein the surface thereof is partially or entirely coated with an electrical insulating material of boron nitride and the amount of boron in a depth of 1 nm from the surface of the vapor grown carbon fiber is about 10% by mass or more, based on the entire mass of the vapor grown fiber having a depth of 1 nm from the surface, and wherein the electrical insulating vapor grown carbon fiber has a specific resistivity of $10^3$ Ω·cm or more when compressed at a bulk density of 0.8 g/cm$^3$.

10. The electrical insulating composite material as described in claim 9, wherein the boron nitride is present in an amount of about 2% by mass or more based on the entire amount of vapor grown carbon fiber and has a Co value of 0.680 nm or less.

11. The electrical insulating composite material as described in claim 9, wherein the amount of boron in a depth of 1 nm from the surface of vapor grown carbon fiber is about 10% by mass or more, based on the entire mass of the vapor grown carbon fiber.

12. The electrical insulating composite material as described in claim 9, wherein the fiber has a heat conductivity of about 150 $Wm^{-1}K^{-1}$ or more when compressed at a bulk density of 0.8 g/cm$^3$.

13. A heat-releasing material comprising an electrical insulating vapor grown carbon fiber having a fiber diameter of 0.01 to 0.5 μm, wherein the surface thereof is partially or entirely coated with an electrical insulating material of boron nitride and the amount of boron in a depth of 1 nm from the surface of the vapor grown carbon fiber is about 10% by mass or more, based on the entire mass of the vapor grown fiber having a depth of 1 nm from the surface, and wherein the electrical insulating vapor grown carbon fiber has a specific resistivity of $10^3$ Ω·cm or more when compressed at a bulk density of 0.8 g/cm$^3$.

14. The heat-releasing material as described in claim 13, wherein the boron nitride is present in an amount of about 2% by mass or more based on the entire amount of vapor grown carbon fiber and the fiber has a Co value of 0.680 nm or less.

15. The heat-releasing material as described in claim 13, wherein the fiber has a heat conductivity of about 150 $Wm^{-1}K^{-1}$ or more when compressed at a bulk density of 0.8 g/cm$^3$.

* * * * *